United States Patent [19]

La Komski et al.

[11] Patent Number: 4,668,041
[45] Date of Patent: May 26, 1987

[54] LOW NOISE TEST CONTACTS FOR PIN GRID ARRAY

[75] Inventors: Greg La Komski, Monte Sereno; Ken Pimental, Santa Clara, both of Calif.

[73] Assignee: Intel Corporation, Santa Clara, Calif.

[21] Appl. No.: 901,207

[22] Filed: Aug. 28, 1986

Related U.S. Application Data

[63] Continuation of Ser. No. 724,999, Apr. 19, 1985, abandoned.

[51] Int. Cl.[4] .................. H01R 13/66; H01R 4/28
[52] U.S. Cl. ....................... 339/147 R; 324/158 F; 339/255 R
[58] Field of Search ......... 339/108 TP, 147 R, 147 P, 339/255 R; 324/72.5, 158 P, 158 F

[56] References Cited

U.S. PATENT DOCUMENTS

| | | | |
|---|---|---|---|
| 3,335,327 | 8/1967 | Damon et al. | 324/158 F |
| 3,866,119 | 2/1975 | Ardezzone et al. | 324/158 F |
| 4,290,815 | 9/1981 | Labriola | 324/158 F |
| 4,413,874 | 11/1983 | Williams | 339/255 R |
| 4,460,868 | 7/1984 | Schmitt et al. | 339/108 TP |
| 4,473,798 | 9/1984 | Cedrone et al. | 324/158 F |
| 4,516,072 | 5/1985 | Marpoe, Jr. | 324/158 F |

OTHER PUBLICATIONS

"Miniature Multiprobe Assembly", IBM Bulletin, vol. 13, No. 5, Oct. 1970, by: Bullard and Wheeler.

Primary Examiner—Gil Weidenfeld
Assistant Examiner—Gary F. Paumen
Attorney, Agent, or Firm—Blakely, Sokoloff, Taylor & Zafman

[57] ABSTRACT

An apparatus for providing an electrical connection between a packaged semiconductor device and a device tester. The apparatus utilizes pogo pins as contactors. The pins are located in a pair of plates, one plate acting as a power source, the other as a ground. A dielectric layer between the plates allows them to act as a charge decoupling capacitor, resulting in a low noise contact.

13 Claims, 6 Drawing Figures

LOW NOISE TEST CONTACTS FOR PIN GRID ARRAY

This is a continuation of application Ser. No. 724,999 filed Apr. 19, 1985, now abandoned.

BACKGROUND OF THE INVENTION

1. Field of the Invention

The present invention relates to the field of pin grid arrays, specifically the means of making electrical contact between those arrays and a testing device.

2. Prior Art

It is often desired to make contact to the pins of a packaged semiconductor chip in order to test the chip's operability. A contactor is used as the link between the chip and the testing apparatus. In the past these contactors have employed both flexible wire and and sheet metal probes as a means for making electrical connections. The most typical manner of connection is a fixed row of contacts flexed along their length to initiate or disengage contact.

An example of a prior art contactor is shown in FIG. 1. The row of contacts 11 flex along their length in the direction shown. The contacts are mounted in an insulator 12 and coupled to leads 13 which provide connection to the testing device.

There is one disadvantage inherent to prior art contactors, namely high inductance leading to high noise. The prior art attempted to solve this problem through the use of a charge decoupling capacitor. However, the effectiveness of a charge decoupling capacitor diminishes over distance and is not effective if located at a distance of greater than 0.25 inches from the device being tested. The configurations of prior art contactors prevented the locating of capacitors within that distance. When flexible wire contacts are used, the wire length is dictated by mechanical considerations to be approximately one inch, thus any capacitors would be at least one inch from the pins, too far to be effective in reducing noise.

Additional problems that plague prior art contactors are short lifetime, unpredictable contact resistance and a limited temperature range of operating effectiveness.

The short lifetime of prior art contactors (10–20,000 cycles of operation) is due to the fact that the contacts themselves are undergoing dynamic stress. If mechanical failure doesn't occur first, degradation of electrical properties may make the contactor ineffective.

The temperature range of operation for prior art contactors is room temperature to approximately 150° C. It is often desired to make connections at sub-zero temperatures, often as low as −55° C., but past PGA contactors have reduced lifetimes at lower temperatures. This is due to the fact that the ductility of metal is reduced at lower temperatures. Reduced ductility results in a higher failure rate and thus, lower life.

The contact resistance is unpredictable for prior art contactors because the surface to surface contact cannot be controlled. The contact resistance is related to force at application of the contactor divided by area contacted. The force of application decreases with ductility of the contactor and area contacted changes as a result of orientation of the contactor. Flat, flexible metal contactors of the prior art do not consistently present the same force or the same surface area in successive contacts, making contact resistance uncontrollable. This factor, in addition to high noise, may cause the tester to indicate a bad device when the device being tested may actually be good. This reduces yields and causes waste of parts, time and money.

The present invention solves the problems of temperature range, contact resistance, lifetime and the problem of location of decoupling resistors, by a simple, yet effective solution.

SUMMARY OF THE INVENTION

The present invention utilizes an array of pogo pins to make contact to packaged devices. The pins are located in a series of plates. A thin layer of dielectric is sandwiched between one plate acting as the power supply to the pin contacting the power input of the device and a second plate acting as ground. The plates as a whole thus act as a decoupling capacitor and can be located near enough to the device being tested to significantly reduce noise and inductance. The pogo pins have a greater lifetime than prior art contacts and can be used at lower temperatures.

DETAILED DESCRIPTION OF THE PRESENT INVENTION

A contactor for connecting a device tester with a packaged device is described. The contactor utilizes pogo pins to make contact to the device and gives reliable, low noise performance over a wide range of temperatures. In the following description, numerous specific details are set forth such as value of capacitance, dielectric thickness, etc., in order to provide a thorough understanding of the present invention. It will be obvious, however, to one skilled in the art, that the present invention may be practiced without these specific details. In other instances, well known devices and structures have not been shown in detail in order not to unnecessarily obscure the present invention.

Figure 1:
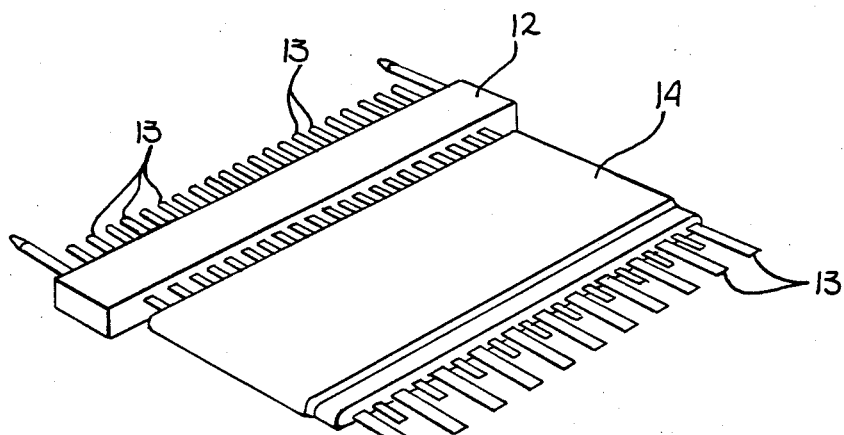
FIG. 1 illustrates an example of a prior art connector.
Figure 2:
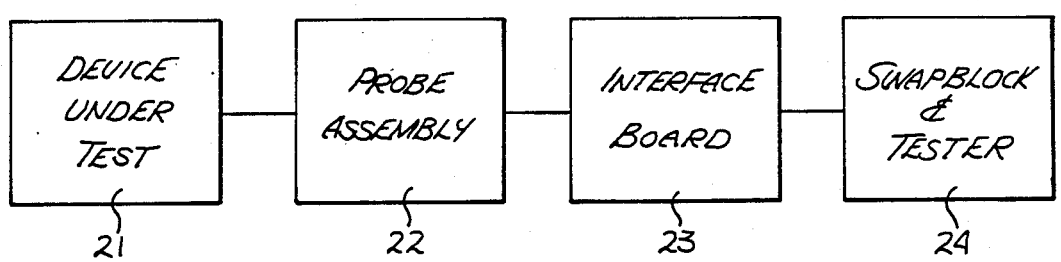
FIG. 2 is a block diagram illustrating the role of the present invention in testing packaged devices.

The basic function of the present invention is best understood by reference to FIG. 2. The device under test 21 is a packaged semiconductor device with a plurality of pins providing contact to the enclosed device. An example of such a device would be Intel's model 80286. The swapblock 24 is a circuit board assembly which connects to the test system being used for a particular device. The purpose of testing the devices is to determine whether any chips of a production run are defective. Each device is given power and fed a series of signals to which the response is already known. During this series of signals, each pin is tested. When the results of the test do not match the predetermined responses, the part is considered bad and is discarded.

In order to provide these test signals to the device, a means of contact is required. The contactor of the present invention consists of probe assemblies 22 and an interface board 23. The probe assemblies 22 make direct contact to the pins of the device 21 while the interface board 23 connects with the swapblock 24.

For such a system to be accurate, the only unknown and uncontrollable portion must be the device being tested. If the contactor is not controllable, a good device may test as bad and be discarded.

Figure 3:
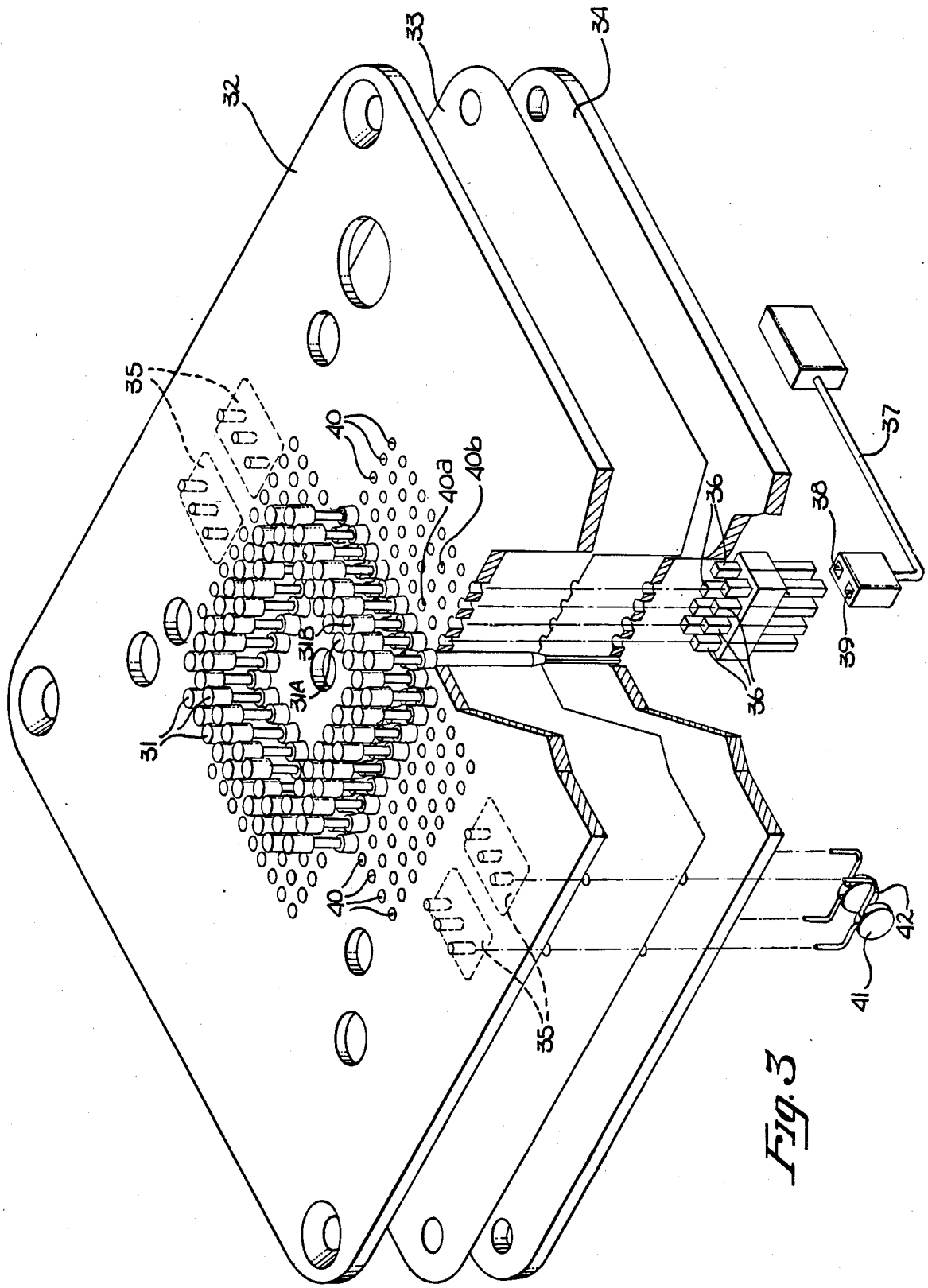
FIG. 3 is a perspective view of the preferred embodiment of the present invention.

A more detailed view of the present invention is shown in FIG. 3. The probe assembly consists of a plurality of pogo pins 31. Pogo pins are spring loaded test probes and are well known in the prior art. Pogo pins are typically employed to test loaded and bare circuit boards. This is the first time they have been applied to the contacting of pin grid arrays. In the preferred embodiment, pogo pins with 40 mil barrels were employed Several advantages are achieved by utilizing pogo pins. First, their construction eliminates the need for the contact portion to have double duty as a deformable member. Here an inner spring is designed to handle repeated cycles and the contact head is not subjected to any forces other than that of contact. This increases the life of the probe assembly. Experiments have demonstrated lifetimes of over 100,000 cycles with the present invention, as opposed to approximately 25,000 for prior art contactors.

Secondly, because the pogo pins are individually spring loaded, devices with pins of varying length can be accommodated and tested.

Third, the pogo pin heads are of sufficient width that the pin of a tested device could be off center by one diameter and yet still make contact with the device.

The interface board is shown as plates 32, 33 and 34. The novel construction of this board permits the placing of a capacitor within ¼" of the device contacts. This is achieved by having the interface board itself act as a capacitor. The top plate 32 is used to provide power to the device being tested. Every pogo pin is insulated from the power plate 32 except the pogo pin (or pins) which contact the power pin (or pins) of the device. The bottom plate 34 acts to provide ground to the device. Again, each pogo pin is shielded from this plate except that pogo pin contacting the ground of the device. The remaining pins are signal pins.

The plate 33 is actually a thin film of dielectric material such as a polymide. An example is Kapton type V by DuPont. The material used should ideally have a dielectric strength in the range 4 to 5. The thickness of 0.001–0.005 inches. This unique configuration turns the plates themselves into a noise decoupling capacitor which is less than ¼" from the device pins when contact is made to the pogo pins. The film must not have a coefficient of thermal linear expansion greater than $5 \times 10^{-5}$ inches/inch/°C. or shorting of the plates will result.

The capacitance of the capacitor formed by the plates is in the range of 800–1500 pF. This alone is not adequate to provide all the charge decoupling that is required. Through pads 35 are built into the interface board for the mounting of capacitors 41 and 42.

Capacitor 41 in the preferred embodiment is a 4700 pF chip capacitor and is mounted in parallel with ceramic capacitor 42 having a capacitance of 0.01 microF. The distance of these supplemental capacitors from the device leads is not critical, and may exceed the ¼" limit without losing effectiveness.

The configuration of the present invention allows control of two important factors in the performance of pin contactors, the first factor being the inductance separating the device power pin from the decoupling capacitor and the second factor being the capacitive loading of the device signal pins. Experiments have shown inductance values as low as 3–6 nH compared to 5–7 nH for sheet metal probes and 33 nH for flexible wires probes. Loading was 11 pF for the present invention and 23–30 pF for other prior art devices.

In addition to the aforementioned improvements, the preferred embodiment of the present invention reduced the peak to peak noise on the ground line from 800 mV to 600 mV. The net result of these improvements is a contactor with less than 1% degradation of tester signals.

Also part of the interface board is a plurality of pins 36. These are 0.1 mil pins used to make connection to the coaxial cables, such as cable 37, which join the interface board to the swapblock. These pins 36 are commonly known as headers. Each pogo pin requires two header pins, one for signal 39 and one for ground 38. The holes, 40, are the installation locations of the headers. One method of connection would have pogo pin 31A electrically coupled to a header pin at hole 40A. This would serve as the signal connection to the pogo pin. Pogo pin 31B would be coupled to a header pin at hole 40B. In the preferred embodiment, the headers, as well as the pogo pins are soldered into the interface board.

The interface board may be assembled from individual parts or formed as a laminated homogenous unit with openings for the pogo pins.

The present invention has a wider temperature range of application than prior art methods. The device has been used to provide contact at −60° C. without a decrease in lifetime. The improved temperature response of the present invention over prior art devices is believed to be due to the fact that the springs of the pogo pins are located in sleeves extending below the interface board. As a result, the environment of the springs during low temperature testing can be maintained at room temperature while the device under test, being above the interface board, can be temperature controlled to the desired test temperature. The springs suffer no loss of ductility and thus have no increased failure rate. The board must be mounted such that separate environments can be maintained above and below the board.

The operation of the present invention is shown in FIG. 4. One row of pins 44 is shown on a device 43 which is to be tested. One pin 46 is shorter than the others and one pin 45 is bent off center. The device will contact the row of pogo pins 31.

Figures 4A, 4B, 4C:
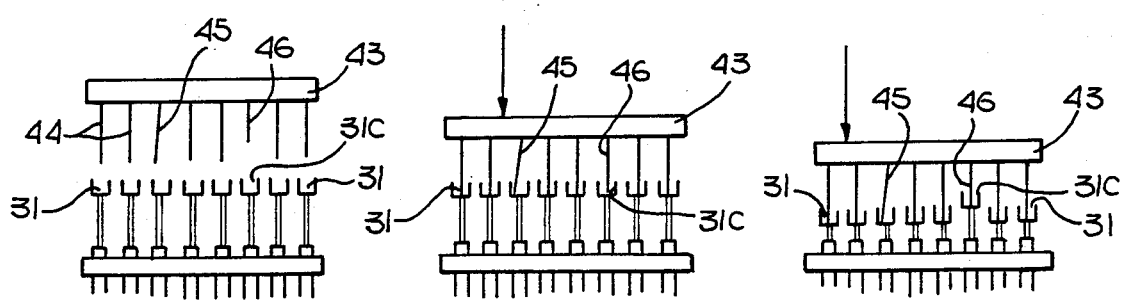
FIGS. 4a, 4b and 4c, illustrate the operation of the present invention.

In FIG. 4b, first contact between the device leads and the pogo pins is shown. Because of the width of the pogo pin heads, the bent lead 45 is still able to make contact. However at this point the short lead 46 does not touch the pogo pin 31C below.

After a force is applied, the pogo pins are displaced downward as is FIG. 4C. Now the short device pin 46 is able to contact the pogo pin below it. At this point the device is tested, the force is removed, the device is taken off, and a new device is tested.

The novel feature of the board capacitor can also be utilized in a contactor for a dual in-line package (DIP). The basic configuration remains the same as for the PGA contactor with a power plate separated from a ground plate by a thin dielectric. Headers provide signal and ground paths between the DIP and the tester. Instead of an array of pins on the surface of the board capacitor, the DIP contactor utilizes two rows of contacts which may be pogo pins or may be a fixed contact.

The preferred embodiment of the invention utilizes pogo pins to make contact to the device under test, but other contacting means may be employed with the board capacitor to achieve low noise contact. For example, fixed metal strips or other means of contact can be employed on the surface of the capacitor plate without affecting the charge decoupling capability of the board capacitor.

Additionally, the present invention can be used in a contactor for LCC (Leadless Chip Carrier) devices. In such an embodiment, the heads of the pogo pins may be eliminated, with the LCC contacting the spring loaded shafts.

Thus, a device has been described which provides a reliable, low noise contact for the testing of pin grid arrays.

We claim:

1. A device for providing contact between leads of a packaged semiconductor chip and a means for testing said packaged chip comprising:
   a contacting means for achieving electrical coupling between said chip leads and said device, said contacting means attached to an interface means, said contact means having a contact member and a deformable member coupled to said contact member, only said deformable member deforming during said electrical coupling;
   said interface means comprising a first plate for providing power to said chip, a second plate for providing an electrical ground to said chip, a layer of dielectric material disposed between said first and second plates such that the combination acts as a charge decoupling capacitor, said interface means being disposed within approximately 0.25 inches of said chip when said chip is being tested using said device;
   a plurality of connecting means coupled to said plates and to said contacting means for providing signal and ground paths between said contacting means and said testing means;
   whereby a low noise, low inductance contact is provided between said chip and said testing means.

2. The device as defined by claim 1 wherein said contacting means comprises a plurality of pogo pins, said pins disposed in an array on said interface means such that there is one of said pins for each of said leads of said chip.

3. The device as defined by claim 1 wherein said dielectric layer is such as to provide approximately 1000 pF of capacitance.

4. The device as defined by claim 2 wherein said connecting means comprise a pair of headers connected to each of said pogo pins, one of said pair providing a signal path, the other of said pair providing a ground path.

5. The device as defined by claim 1 wherein said interface means includes additional capacitance electrically coupled in parallel to said interface means, said additional capacitance used for noise decoupling and providing approximately 0.0147 micro F of capacitance.

6. A device for providing contact between the leads of a packaged semiconductor chip and a means for testing said chip comprising
   a plurality of pogo pins having contact members for contacting said chip leads, said pins attached to an interface board;
   said interface board comprising a first layer for providing power to said chip, a second layer for providing an electrical ground to said chip and a third layer comprised of dielectric material disposed between said first and second layers such that said first and second layers and said dielectric layer act as a charge decoupling capacitor, said interface board being disposed within approximately 0.25 inches of said chip when said chip is being tested using said device;
   said first layer coupled electrically to those of said pins contacting the power leads of said chip;
   said second layer coupled electrically to those of said pins contacting the ground leads of said chip;
   a plurality of headers connected to said interface board and electrically coupled to said pins for providing signal and ground paths between said pins and said testing means;
   a plurality of capacitors coupled in parallel to said interface board, said capacitors used as decoupling capacitors;
   whereby a low noise, reliable means of providing contact between said chip and said testing means is provided.

7. The device as defined by claim 6 wherein said pins are attached to said interface board in an array configuration such that each pin makes contact with one lead of said chip.

8. The device as defined by claim 6 wherein said dielectric layer is comprised of polyimide and is approximately 0.001–0.005 inches in thickness.

9. The device as defined in claim 6 wherein said plurality of capacitors comprises a 4700 pF and a 0.01 microF capacitor.

10. A device for providing contact between the leads of a packaged semiconductor chip and a means for testing said chip in a low temperature environment comprising:
   a plurality of pogo pins having contact members for contacting said chip leads, said pins attached to an interface board such that a first portion of each of said pogo pins extends above said board and a second portion extends below said board, said second portion including spring means for axial movement of said pogo pins;
   said interface board comprising a first layer for providing power to said chip, a second layer for providing an electrical ground to said chip and a third layer comprised of dielectric material disposed between said first and second layers such that said first and second layers and said dielectric layer act as a charge decoupling capacitor, said interface board being disposed within approximately 0.25 inches of said chip when said chip is being tested using said device;
   said first layer coupled electrically to those of said pins contacting the power leads of said chip;
   said second layer coupled electrically to those of said pins contacting the ground leads of said chip;
   a plurality of headers connected to said interface board and electrically coupled to said pins for providing signal and ground paths between said pins and said testing means;
   a plurality of capacitors coupled in parallel to said interface board, said capacitors used as decoupling capacitors;
   a mounting means for positioning said device such that different environments can be maintained above and below said interface board;

whereby said chip may be tested at a reduced temperature and said second portion of said pogo pins can be maintained at room temperature, reducing the likelihood of failure of said spring means.

11. The device as defined by claim 10 wherein said pins are attached to said interface board in an array configuration such that each pin makes contact with one lead of said chip.

12. The device as defined by claim 10 wherein said dielectric layer is comprised of ployimide and is approximately 0.001–0.005 inches in thickness.

13. The device as defined in claim 10 wherein said plurality of capacitors comprises a 4700 pF and a 0.01 microF capacitor.

* * * * *